United States Patent
Fujita et al.

(10) Patent No.: US 7,642,538 B2
(45) Date of Patent: Jan. 5, 2010

(54) SWITCHING ELEMENT, LINE-SWITCHING DEVICE AND LOGIC CIRCUIT

(75) Inventors: Shinobu Fujita, Kawasaki (JP); Keiko Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 453 days.

(21) Appl. No.: 11/234,119

(22) Filed: Sep. 26, 2005

(65) Prior Publication Data

US 2006/0102927 A1    May 18, 2006

(30) Foreign Application Priority Data

Nov. 17, 2004 (JP) ............................. 2004-333254
Mar. 28, 2005 (JP) ............................. 2005-092288

(51) Int. Cl.
*H01L 47/00* (2006.01)
*H01L 29/68* (2006.01)
(52) U.S. Cl. .................... 257/2; 257/130; 257/E29.325
(58) Field of Classification Search .................. 257/2, 257/130, E29.068, E29.079, E29.087, E29.325
See application file for complete search history.

(56) References Cited

U.S. PATENT DOCUMENTS

| 5,789,758 | A | 8/1998 | Reinberg |
| 7,221,579 | B2 * | 5/2007 | Krusin-Elbaum et al. ... 365/148 |
| 2004/0234895 | A1 | 11/2004 | Lee et al. |

OTHER PUBLICATIONS

T. Sakamoto, et al., "A Nonvolatile Programmable Solid Electrolyte Nanometer Switch", Technical Digest of International Solid-State Circuits Conference 2004, Session 16, No. 16-3, TD: Emerging Technologies and Circuits, Salon 10-15, Feb. 17, 2004, (10 pages).

* cited by examiner

*Primary Examiner*—Lex Malsawma
(74) *Attorney, Agent, or Firm*—Oblon, Spivak, McClelland, Maier & Neustadt, L.L.P.

(57) ABSTRACT

A switching element for ON/OFF switching includes a pair of electrodes provided on a substrate separately from each other, a phase change film contacting the electrodes and having its resistance varied in accordance with the history of heating, and a heating mechanism for heating the phase change film.

6 Claims, 11 Drawing Sheets

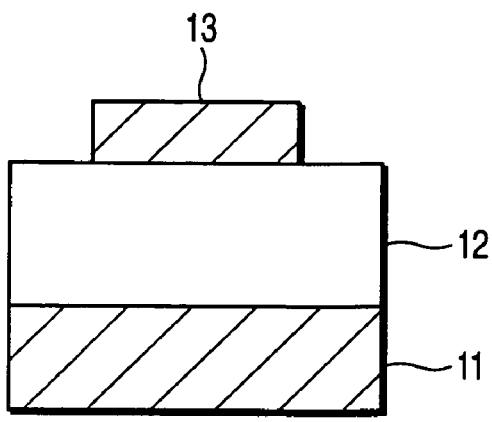
F I G. 1A
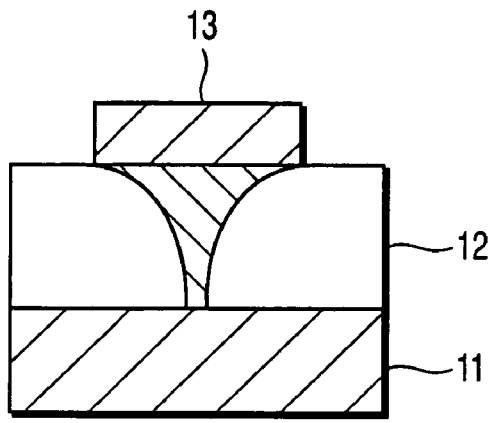
F I G. 1B
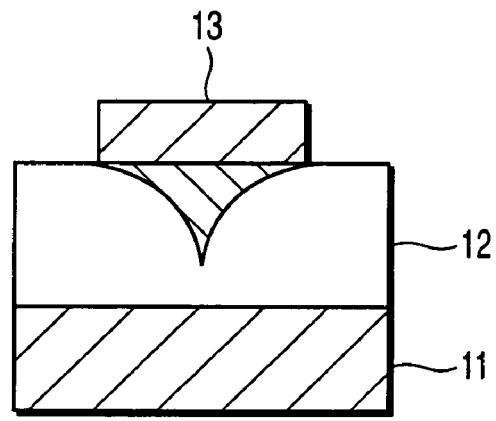
F I G. 1C
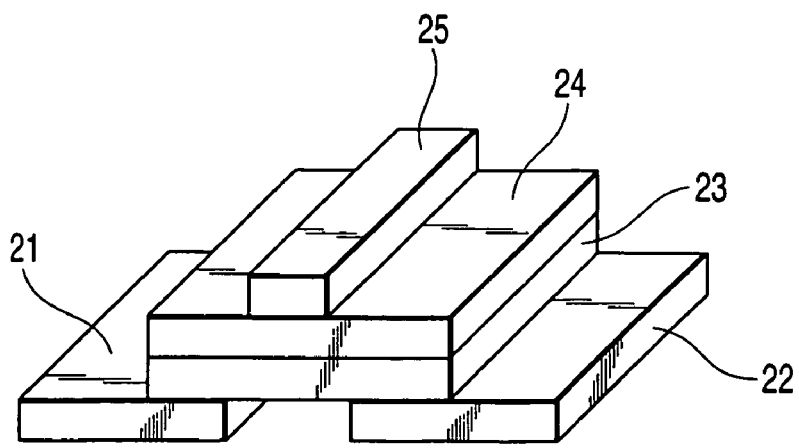
F I G. 2

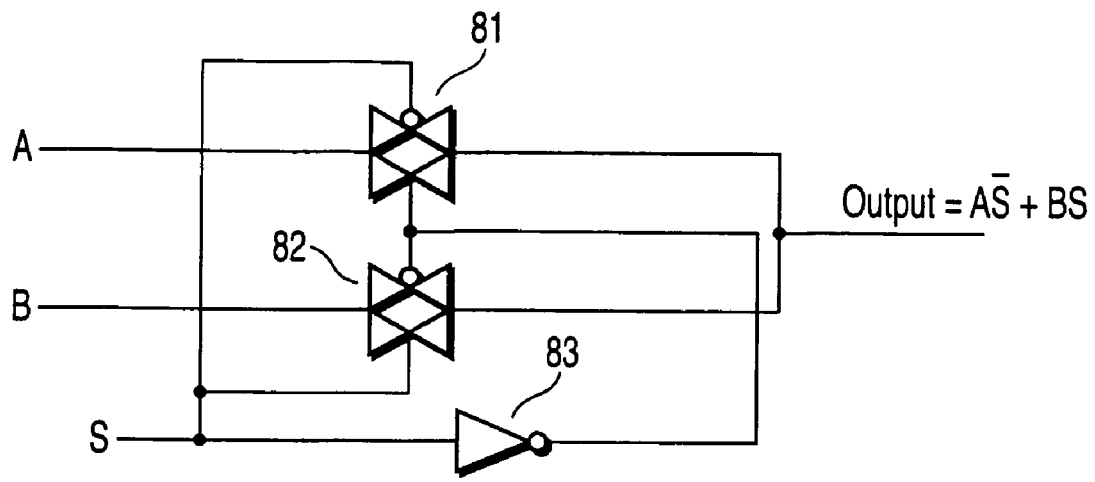
F I G. 12A
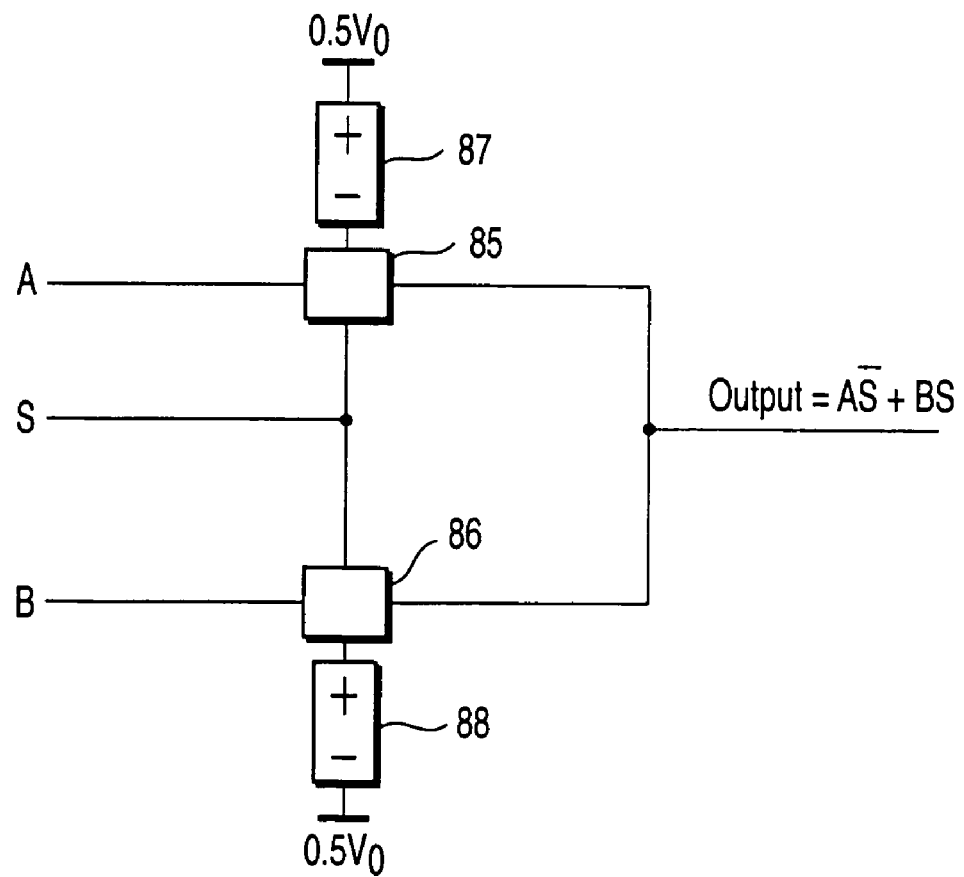
F I G. 12B

SWITCHING ELEMENT, LINE-SWITCHING DEVICE AND LOGIC CIRCUIT

CROSS-REFERENCE TO RELATED APPLICATIONS

This application is based upon and claims the benefit of priority from prior Japanese Patent Applications No. 2004-333254, filed Nov. 17, 2004; and No. 2005-092288, filed Mar. 28, 2005, the entire contents of both of which are incorporated herein by reference.

BACKGROUND OF THE INVENTION

1. Field of the Invention

The present invention relates to a switching element using a phase change film having its resistance varied in accordance with the state of crystal. It also relates to a line-switching device and logic circuit using the switching element.

2. Description of the Related Art

Conventional crossbar circuits used for a field programmable gate array (FPGA) comprise an SRAM formed of six transistors, and a MOSFET as a switching element (see T. Sakamoto, et al., Technical Digest of International Solid State Circuit Conference 2004, No. 1603). When "0" is written to the SRAM, the MOSFET is turned on, while when "1" is written thereto, the MOSFET is turned off. Accordingly, a plurality of lines in an LSI can be dynamically switched by turning on/off the MOSFET.

However, this type of device has the following problem. In the case of a typical FPGA, the crossbar circuits occupy a large area, and a greater part of each crossbar circuit is occupied by the SRAM. Further, the leakage current of the SRAM incorporated in each crossbar circuit is large. In a microfabrication technique of 0.1 µm or less, the leakage current of the transistors is significantly increased in accordance with the development of microfabrication, thereby increasing the power consumption of the entire circuit.

As described above, in the conventional crossbar circuits formed of an SRAM and MOSFET, the SRAM occupies a large area and exhibits a large leakage current.

BRIEF SUMMARY OF THE INVENTION

In accordance with a first aspect of the invention, there is provided a switching element comprising:

a pair of electrodes provided on a substrate separately from each other;

a phase change film provided in contact with the electrodes, a resistance of the phase change film being varied in accordance with a history of heating; and a heating mechanism which heats the phase change film.

In accordance with a second aspect of the invention, there is provided a switching element comprising:

a first metal wire;

a second metal wire opposing the first metal wire and having a lower degree of ionization than the first metal wire;

an ion-conducting medium interposed between the firsts metal wire and the second metal wire and permitting ions of the first metal wire to be conducted therethrough; and a pair of opposing electrodes interposed between the first metal wire and the second metal wire and electrically isolated from the first metal wire and the second metal wire.

In accordance with a third aspect of the invention, there is provided a line-switching device comprising:

a plurality of first wires provided parallel to each other on a substrate;

a plurality of second wires provided parallel to each other on the substrate and intersecting the first wires;

switching elements provided at intersections of the first wires and the second wires, each of the switching elements including a pair of electrodes provided on the substrate separately from each other, a phase change film provided in contact with the electrodes, a resistance of the phase change film being varied in accordance with a history of heating, and a heating mechanism which heats the phase change film, one of the electrodes of each switching element being connected to a corresponding one of the first wires, and the other electrode of the each switching element being connected to a corresponding one of the second wires; and a control circuit which controls ON and OFF states of the switching elements by controlling a heating mechanism which heats the switching elements.

In accordance with a fourth aspect of the invention, there is provided a switching element comprising:

an ion-conducting medium which conducts metal ions therethrough;

a first metal electrode opposing part of the ion-conducting medium with an insulation film interposed therebetween, the insulation film having a higher resistance than the ion-conducting medium;

a second metal electrode provided on the ion-conducting medium with a tunnel insulation film interposed therebetween, the tunnel insulation film permitting electrons to be tunnel-conducted therethrough, the second metal electrode being separate from the first metal electrode;

a third metal electrode provided between the first metal electrode and the second metal electrode in contact with the ion-conducting medium, and configured to be ionized into metal ions which are conducted through the ion-conducting medium; and a fourth metal electrode formed of a material having a lower degree of ionization than a material of the third metal electrode, the fourth metal electrode being provided in contact with the ion-conducting medium and closer to the second metal electrode than the third metal electrode.

BRIEF DESCRIPTION OF THE SEVERAL VIEWS OF THE DRAWING

FIG. 1A is a sectional view schematically illustrating the structure of a two-terminal type switching element;

FIG. 1B is a sectional view illustrating a state in which the switching element of FIG. 1A is in the ON state;

FIG. 1C is a sectional view illustrating a state in which the switching element of FIG. 1A is in the OFF state;

FIG. 2 is a perspective view illustrating the fundamental structure of a switching element employed in the invention;

FIG. 12A is a circuit diagram illustrating a multiplexer formed of six transistors and used as an example of a logic circuit using a switching element;

FIG. 12B is a circuit diagram illustrating an example of a logic circuit using a switching element according to a seventh embodiment;

DETAILED DESCRIPTION OF THE INVENTION

Figure 3:
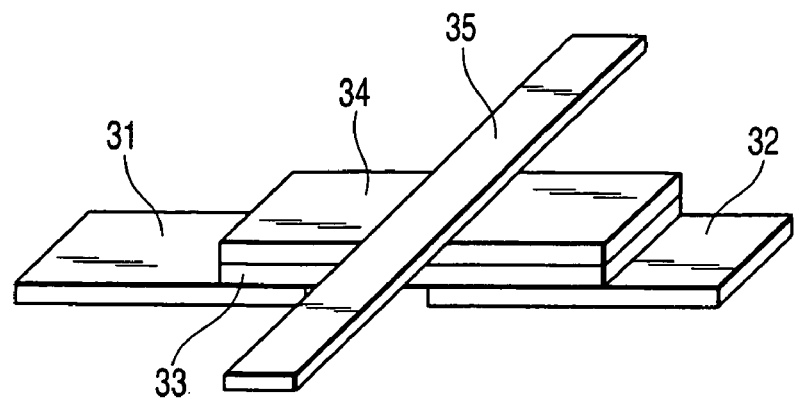
FIG. 3 is a perspective view schematically illustrating the structure of a switching element according to a first embodiment.

Before describing embodiments of the invention, the fundamental idea of the present invention will firstly be described.

To realize, for example, a crossbar circuit without using, for example, an SRAM of a large area and leakage current, the invention employs a switching element having a memory function. As a switching element with a memory function, such a two-terminal type switching element as shown in FIG. 1A is exemplified.

FIG. 1A is a sectional view schematically illustrating the structure of a two-terminal type switching element. In the figure, reference numeral 11 denotes a Cu electrode, reference numeral 12 denotes a CuS layer (high-resistance layer), and reference numeral 13 denotes a Ti electrode.

In the element structure as shown in FIG. 1A, when a voltage is applied between the two terminals (electrodes) 11 and 13, Cu ions are conducted through the CuS layer 12, thereby forming a conduction path as shown in FIG. 1B (ON state). As a result, the resistance of the layer 12 is reduced to 50Ω. In contrast, when a reverse voltage is applied, Cu ions are conducted in the direction opposite to the above as shown in FIG. 1C, with the result that the layer 12 is returned to the original high resistance ($>10^6 \Omega$) state (OFF state). Thus, the structure functions as a switching element.

In the above structure, however, a single electrode is used as both the input/output electrode, and the electrode for controlling the ON/OFF of the switching element. Therefore, it is necessary to provide a circuit for switching, which inevitably increases the circuit scale. To reduce the circuit scale, it is desirable that the electrode for controlling the ON/OFF of the switching element be independent of the input/output electrode.

In light of this, the invention employs such a switching element as shown in FIG. 2, which utilizes a phase change film. In FIG. 2, reference numeral 21 denotes an input electrode, reference numeral 22 denotes an output electrode, and reference numeral 23 denotes a phase change film including, for example, a GeSeTe layer that has its resistance in accordance with temperature. Further, reference numeral 24 denotes an insulation film, and reference numeral 25 denotes a heat source (heating mechanism), such as a resistance heating device, optical heating device or electron-beam heating device.

In the element structure shown in FIG. 2, when the phase change film 23 is heated by the heat source 25 to a temperature (e.g., 130°???) suitable for crystallization, it is changed to a crystal phase (low-resistance phase). This state is maintained even if heating is stopped. Further, when the phase change film 23 is heated by the heat source 25 to a temperature (e.g., 610°) sufficiently higher than the temperature suitable for crystallization, it is changed to an amorphous phase (high-resistance phase). This state is also maintained even if heating is stopped. Thus, the heat source 25, which is an element different from the input and output terminals 21 and 22, can control the ON/OFF of the switching element.

The invention aims to use the switching element constructed as above to reduce the power consumption and size of the crossbar circuit.

First Embodiment

Figure 4:
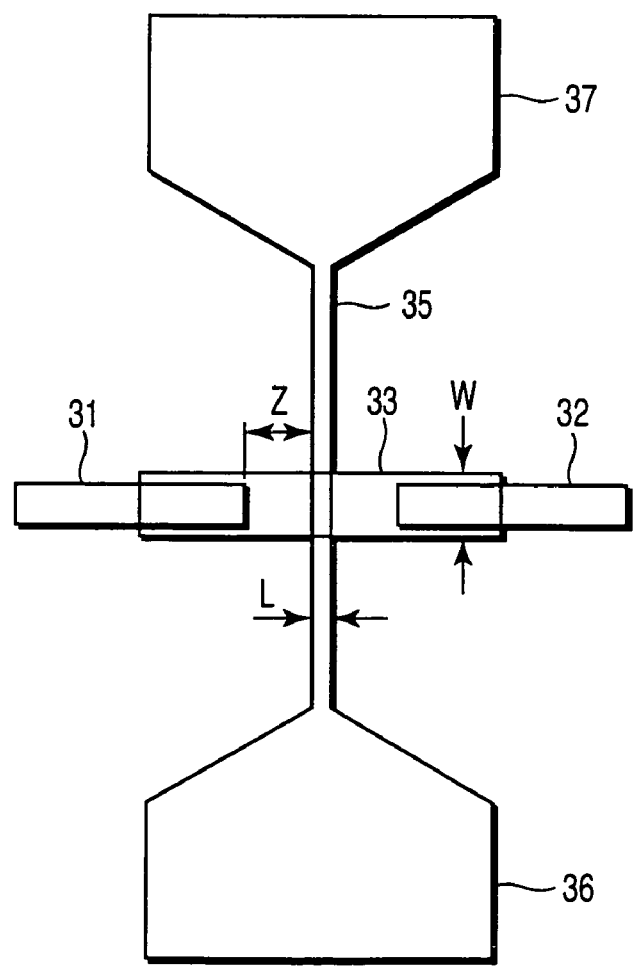
FIG. 4 is a plan view schematically illustrating the structure of the switching element according to the first embodiment.

FIGS. 3 and 4 are schematic views showing the structure of a switching element according to a first embodiment of the invention. FIG. 3 is a perspective view, and FIG. 4 is a plan pattern diagram. In the figures, reference numeral 31 denotes an input electrode, reference numeral 32 denotes an output electrode, and reference numeral 33 denotes a phase change film. Further, reference numeral 34 denotes an insulation film, reference numeral 35 denotes a resistance heating member, and reference numerals 36 and 37 denote conducting electrodes.

The electrodes 31 and 32 are located on a substrate, not shown, with a certain distance therebetween, and the phase change film 33 bridges the electrodes 31 and 32. More specifically, the phase change film 33 continuously grows from the upper surface of the input electrode 31 to that of the output electrode 32. The phase change film 33 is formed of, for example, GeSeTe, and has its resistance varied in accordance with the state of the crystal. The insulation film 34 formed of, for example, SiO$_2$ is provided on the phase change film 33, and a thin-line electrode is provided as the resistance heating member 35 on the insulation film 34.

Thus, in the embodiment, the thin-line electrode (resistance heating member) 35 for controlling the ON/OFF of the switching element is formed independent of the input and output electrodes 31 and 32. Namely, the insulation film 34 is heated by supplying power to the thin-line electrode 35 for heating, thereby heating the phase change film 33 utilizing heat conduction. The resistance of the phase change film 33 is increased or decreased in accordance with the heating temperature, to control the ON/OFF of the switch element.

For the ON/OFF control, if the electrical conduction time of the line electrode 35 is set constant, when a current that causes the phase change film 33 to be set to about 130° is supplied thereto, the variable phase film 33 is made to have a crystal phase and a low resistance (e.g., 2 kΩ). Further, when a current sufficiently larger than the above current is supplied, the variable phase film 33 is made to have an amorphous phase and a high resistance (e.g., 100 kΩ). In contrast, if the current to be supplied is made constant, the variable phase film 33 can be set to a high temperature to have the amorphous phase by elongating the current supply time. Further, when the current supply time is reduced to set the film 33 to about 130°, the film 33 is shifted to the crystal phase.

If switching elements similar to the above are used as crossbar circuits and arranged in an array, a line-switching device, as will be described later, is realized. In this case, the heating electrodes 36 and 37 of each switching element are connected to a power supply circuit (control circuit) that can vary the amount of current or the time of electrical conduction.

In FIG. 4, reference symbol W denotes the width of the phase change film 33, reference symbol L denotes the width of the thin-line electrode 35, and reference symbol Z denotes the distance from the edge of the thin-line electrode 35 to the edge of each of the electrodes 31 and 32. In this embodiment, W, L and Z are set to 100 nm, 200 nm and 300 nm, respectively. However, W, L and Z may be set to appropriate values in accordance with the material of the phase change film 33, the amount of current and the electrical conduction time, etc., so that the film 33 can easily assume a high-resistance state and low-resistance state when a current is supplied to the thin-line electrode 35.

A tungsten electrode superior in heat resistance, for example, is used as the thin-line electrode 35. The tungsten electrode is formed by performing film forming using sputtering or chemical deposition, and then performing etching and lithography on the resultant film to acquire a desired shape.

FIGS. 5A to 5E are sectional views illustrating a process for manufacturing the switching element of the embodiment.

Figure 5A:
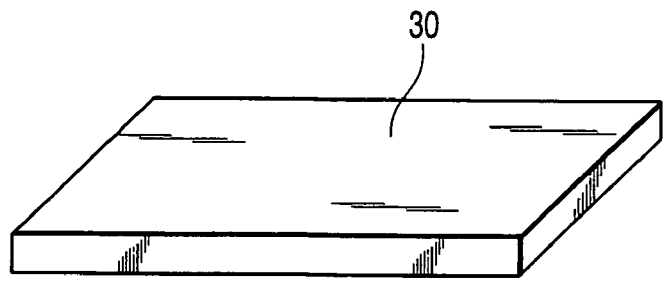
FIGS. 5A to 5E are sectional views illustrating the manufacturing process of the switching element of the first embodiment.

Firstly, as shown in FIG. 5A, an Al wiring film 30 is formed on, for example, a substrate (not shown) using, for example, CVD.

Figure 5B:
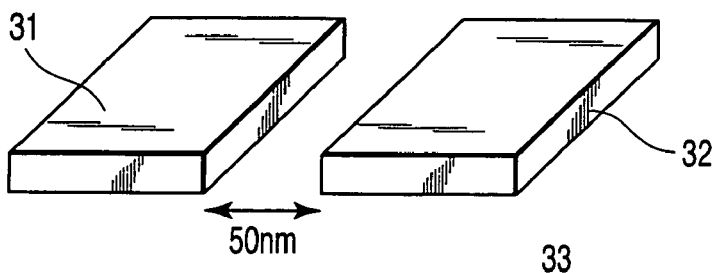

Subsequently, as shown in FIG. 5B, the Al wiring film 30 is etched into a desired electrode pattern, thereby forming the input and output electrodes 31 and 32 with a gap of, for example, 50 nm therebetween.

Figure 5C:

After that, as shown in FIG. 5C, the phase change film 33 made of GeSeTe is formed by deposition. Sputtering is utilized to deposit the film 33. This process is widely employed for, for example, mediums for DVD-RAMs.

Figure 5D:
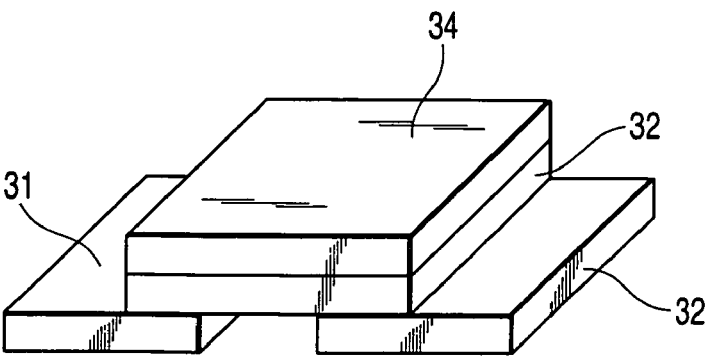

Thereafter, as shown in FIG. 5D, the insulation film 34 made of SiO2 is formed on the phase change film 33 by CVD, and then the insulation film 34 and phase change film 33 are subjected to selective etching. At this time, the phase change film 33 is made to overlap with the electrodes 31 and 32.

Figure 5E:
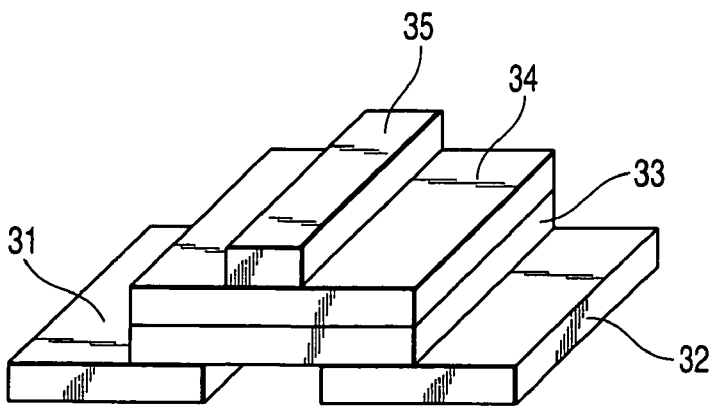

As shown in FIG. 5E, a gate metal (resistance heating member) 35 of W/TiN is deposited on the insulation film 34 and etched by lithography into a thin-line electrode. As a result, the structure as shown in FIG. 3 is acquired.

As described above, in the first embodiment, the switching element is realized using the phase change film 33, and the ON/OFF of the switching element can be controlled by controlling the conduction state of the resistance heating member 35. The switching element of the embodiment is a nonvolatile one, therefore does not require power supply except for the time of ON/OFF switching. Moreover, the resistance (ON resistance) between the input and output when the switching element is in the ON state is low, and the signal transmission delay is small. Further, since the switching element itself has a memory function, a memory section such as an SRAM is not needed, and hence the element area can be extremely reduced.

Second Embodiment

Figure 6:
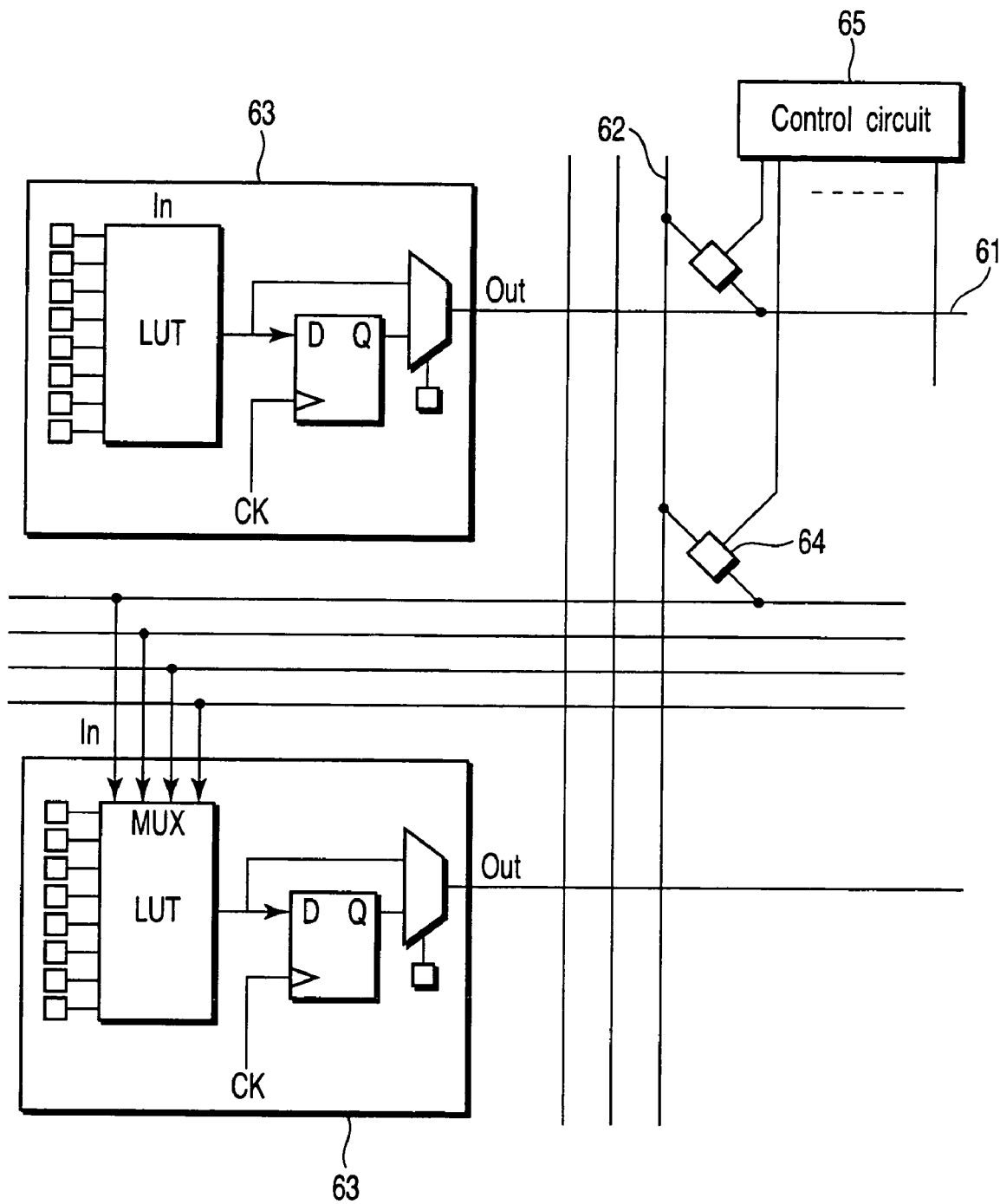
FIG. 6 is a circuit diagram illustrating a line-switching device according to a second embodiment.

FIG. 6 is a circuit diagram illustrating a line-switching device according to a second embodiment of the invention. This device is part of an FPGA.

On a substrate, not shown, a plurality of logic circuits 63 are provided, a plurality of lines (first lines) 61 are arranged in the row direction, and a plurality of lines (second lines) 62 are arranged in the column direction. The terminal of each logic circuit 63 is connected to the corresponding one of the lines 61.

A switching element 64 is provided as a crossbar circuit at each intersection of the lines 61 and 62. One electrode of the switching element 64 is connected to the line 61, and the other electrode is connected to the line 62. The ON/OFF of the switching element 64 is controlled by a control command from a control circuit 65.

The switching element 64 employed in the second embodiment is similar to that in the first embodiment, and constructed as shown in FIGS. 3 and 4. The conducting electrodes 36 and 37 of each switching element 64 are connected to the control circuit 65, and the current flowing therethrough is controlled by the control circuit 65.

In the above structure, the control circuit 65 controls the current flowing through each switching element 64 to control the ON/OFF states of each element 64. More specifically, each element 64 is switched between the ON and OFF states by supplying thereto a current pulse corresponding to the ON or OFF state.

In the second embodiment, each crossbar circuit is formed of a single switching element, which can be formed three-dimensionally with respect to a MOSFET on an Si substrate. Accordingly, the area required for each crossbar circuit can be significantly reduced, compared to the prior art in which each crossbar circuit is formed of an SRAM and MOSFET. Namely, the area occupied by the crossbar circuits in an FPGA can be reduced. Furthermore, the switching element 64 requires supply of a current only when it is switched between the ON and OFF states. Therefore, the leakage current can be reduced, which enables an FPGA small in size and power consumption to be provided.

Third Embodiment

Figure 7:
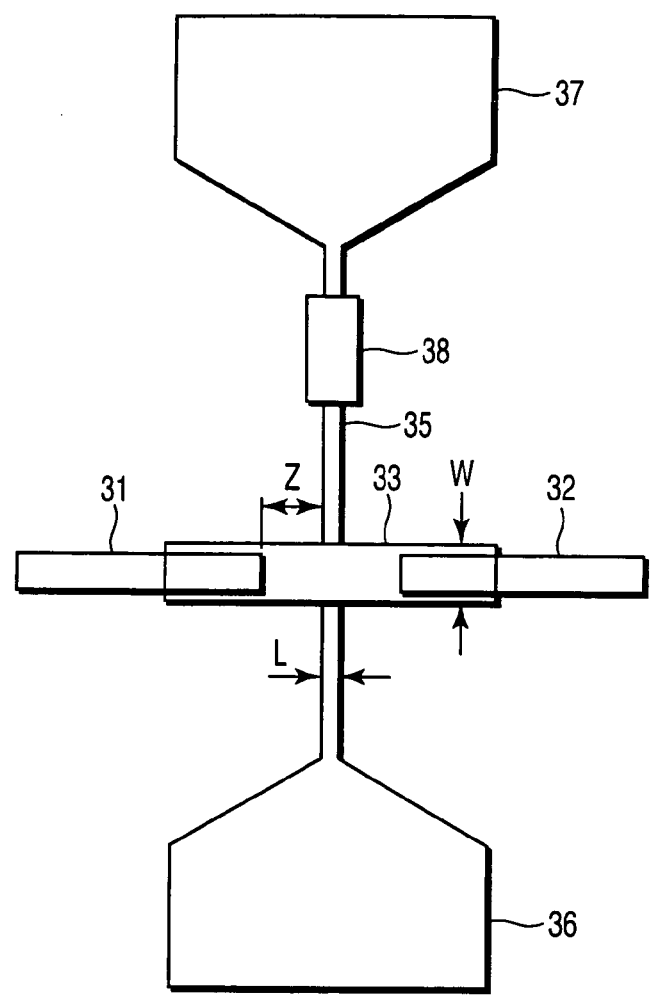
FIG. 7 is a plan view schematically illustrating the structure of a switching element according to a third embodiment.

FIG. 7 is a plan view schematically illustrating the structure of a switching element according to a third embodiment.

In FIG. 7, elements similar to those of FIG. 4 are denoted by corresponding reference numerals, and no detailed description will given thereof.

Figure 8:
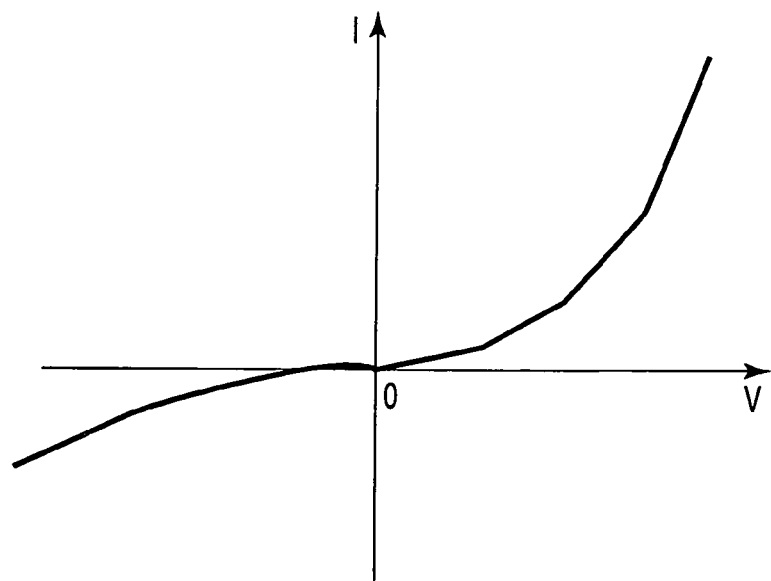
FIG. 8 is a graph illustrating the voltage-current characteristic of a nonlinear resistance element used as the switching element of FIG. 7.

The third embodiment differs from the first embodiment in that in the former, a non-linear resistance element 38 is connected in series to the resistance heating member 35. As shown in FIG. 8, in the non-linear resistance element 38, its resistance (and hence the amount of the current flowing therethrough) is varied when the polarity of the voltage is varied, even if the voltage level is not varied.

When the non-linear resistance element 38 is connected in series to the resistance heating member 35, even if the absolute value of the voltage applied between the conducting electrodes 36 and 37 is unchanged, the amount of the current flowing therethrough can be varied simply by varying the application direction of the voltage. Namely, the heating temperature of the phase change film 33 can be varied simply by varying the polarity of the voltage applied. At this time, if an appropriate voltage is selected, the phase change film 33 can be switched between the crystal phase and the amorphous phase, whereby the switching element can be switched between the ON and OFF states.

In the first embodiment, to switch the phase change film 33 between the high temperature and the low temperature, it is necessary to vary the electrical conduction time or the amount of current (the level of voltage) in the power supply circuit (control circuit). In contrast, in the third embodiment where the nonlinear resistance element 38 constructed as the above is connected between the conducting electrodes 36 and 37, it is sufficient if the power supply circuit changes the polarity of voltage.

Figure 9A:
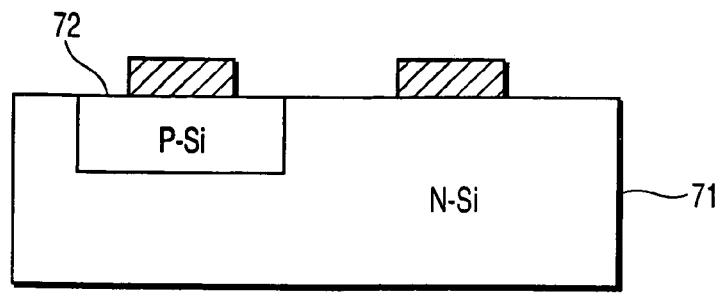
FIGS. 9A and 9B are sectional views illustrating examples of the nonlinear resistance element.
Figure 9B:
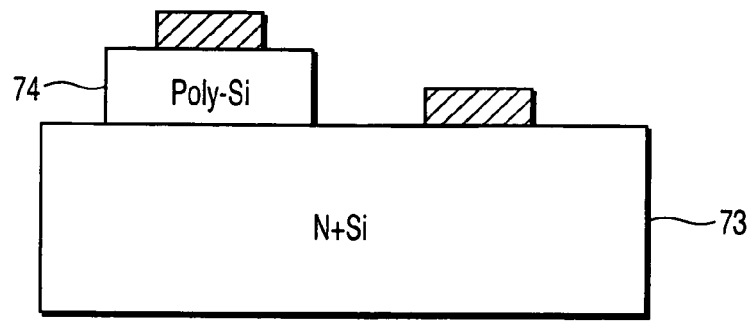

The nonlinear resistance element 38 in the third embodiment can be formed of diodes shown in FIGS. 9A and 9B. FIG. 9A shows a pn-junction diode in which a p-type Si layer 72 is formed on part of the surface of an n-type Si substrate 71. FIG. 9B shows a pn-junction diode in which a polysilicon layer 74 is formed on part of the surface of an $n^+$-type Si substrate 73.

In standard diodes, the forward-directional resistance is extremely low and the reverse-directional resistance is extremely high. The diodes employed in the third embodiment are made to have degraded diode characteristics, but to have a somewhat reduced reverse-directional resistance. The forward-directional and reverse-directional resistances can be easily set to desired values by controlling the concentrations of impurities implanted in the p-type and n-type semiconductor substrates.

As described above, the third embodiment provides, like the first embodiment, a switching element having the phase change film 33, which is switchable between the ON and OFF states by controlling the direction of the current flowing through the resistance heating member 35. Thus, the third embodiment can provide the same advantage as the first embodiment. The third embodiment is also advantageous in that the control circuit connected to the conducting electrodes 36 and 37 can be simplified in structure.

Fourth Embodiment

A fourth embodiment of the invention will be described.

In the fourth embodiment, such a switching element as shown FIGS. 3 and 4 is used as in the first embodiment, and the voltage applied to the conducting electrodes 36 and 37 is contrived.

A voltage $-V_0$ [V], which is the inversion voltage of a power supply voltage $V_0$ [V], is always applied to the electrode 36, while the power supply voltage $V_0$ [V] and 0 [V] are applied to the electrode 37 when the switching element is in the ON and OFF states, respectively. When $V_0$ [V] is applied to the electrode 37, the potential difference between the electrodes 36 and 37 is $2V_0$ [V]. When 0 [V] is applied to the electrode 37, the potential difference between the electrodes 36 and 37 is $V_0$ [V]. In other words, simply by setting, to "H" or "L", the voltage applied to the electrode 37, the potential difference between the electrodes 36 and 37 can be controlled to 2:1.

In the fourth embodiment constructed as the above, the current supplied to the resistance heating member 35 can be controlled in the same manner as in the third embodiment, thereby switching the switching element between the ON and OFF states. As a result, the fourth embodiment can provide the same advantage as the first embodiment. The third embodiment is also advantageous in that the control circuit connected to the conducting electrodes 36 and 37 can be simplified in structure, and in that the four-terminal element can be used as the switching element or logic circuit element without connecting a nonlinear resistance element in series.

Fifth Embodiment

Figure 10:
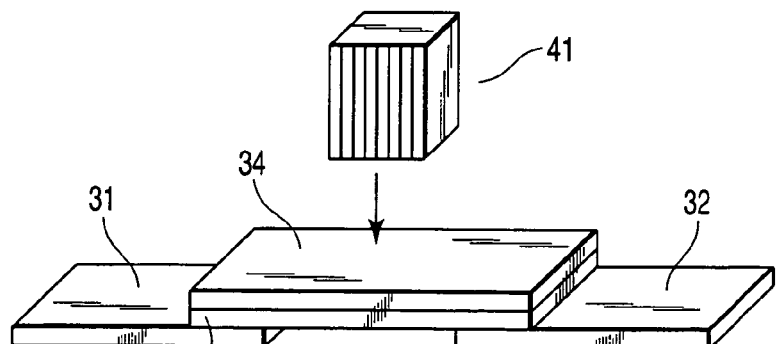
FIG. 10 is a perspective view schematically illustrating the structure of a switching element according to a fifth embodiment.

FIG. 10 is a perspective view schematically illustrating the structure of a switching element according to a fifth embodiment. In FIG. 10, elements similar to those of FIG. 3 are denoted by corresponding reference numerals, and no detailed description will given thereof.

The fifth embodiment differs from the first embodiment in that in the former, a light source is used instead of the resistance heating member 35 as a heat source. Specifically, no resistance heating member is provided on the insulation film 34, and a semiconductor laser (LD) 41 is provided above the insulation film 34 instead.

In this structure, the insulation film 34 is heated by the LD 41, thereby heating the phase change film 33. By controlling the driving period of the LD 41, the ON/OFF of the switching element can be controlled. As a result, the same advantage as in the first embodiment can be acquired.

Note that, in the fifth embodiment, to sufficiently absorb light emitted from the LD 41, it is necessary to form the insulation film 34 of a material that has high infrared absorbency. Further, it is desirable to provide a transparent material of a high adiathermic property above the insulation film 34, and provide a material of a high adiathermic property below the phase change film 33. If the phase change film 33 is formed of a material having high infrared absorbency, the insulation film 34 can be omitted.

Sixth Embodiment

Figure 11:
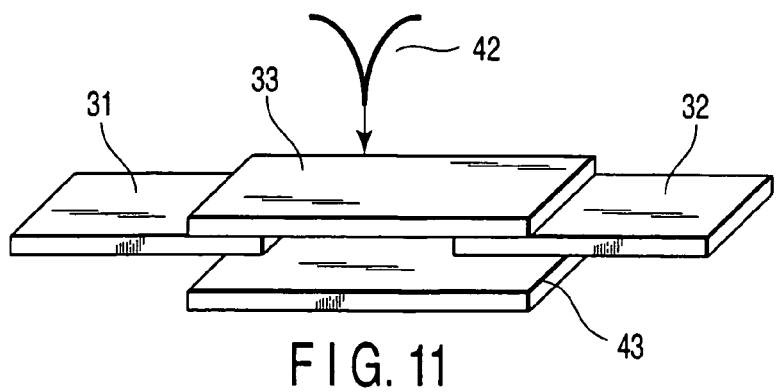
FIG. 11 is a perspective view schematically illustrating the structure of a switching element according to a sixth embodiment.

FIG. 11 is a perspective view schematically illustrating the structure of a switching element according to a sixth embodiment. In FIG. 11, elements similar to those of FIG. 3 are denoted by corresponding reference numerals, and no detailed description will given thereof.

The sixth embodiment differs from the first embodiment in that in the former, an electron source is used instead of the resistance heating member 35 as a heat source. Namely, no resistance heating member is provided on the insulation film 34, and a small electron source 42 such as a field emission device (FED) is provided above the insulation film 34 instead.

More specifically, the small electron source 42, which has a small curvature radius, is provided as a heat source near the phase change film 33. Further, an anode 43 independent of the input and output electrodes 31 and 32 is provided below the phase change film 33. A desired voltage is applied to the anode 43 to make the electron source 42 to emit an electron beam. The electron beam is absorbed by the phase change film 33, where it is converted into heat. Thus, by controlling the period of emitting the electron beam, the temperature of the phase change film 33 can be controlled. If the phase change film 33 has low electron absorbency, an insulation film of high electron absorbency may be provided on the phase change film 33.

In this structure, the phase change film 33 can be heated by the electron source 42, and the ON/OFF of the switching element can be controlled by controlling the driving period of the electron source 42. As a result, the same advantage as in the first embodiment can be acquired.

Seventh Embodiment

FIGS. 12A and 12B are views useful in explaining a seventh embodiment of the invention. FIG. 12A is a circuit diagram illustrating a conventional multiplexer formed of six transistors. FIG. 12B is a circuit diagram illustrating a multiplexer according to the seventh embodiment.

As shown in FIG. 12A, the conventional multiplexer comprises two transfer gates 81 and 82 and an inverter 83. Since the transfer gates 81 and 82 and inverter 83 each comprise two MOS transistors, six MOS transistors are used in total.

In contrast, the multiplexer of the seventh embodiment comprises, instead of the transfer gates 81 and 82 shown in FIG. 12A, such switching elements 85 and 86 as shown in FIG. 3, 4 or 7, and nonlinear resistance elements 87 and 88 connected in series to the switching elements, as is shown in FIG. 12B. The nonlinear resistance elements 87 and 88 exhibit a low resistance when a current is flown from + to − in FIG. 12B. Assume here that a digital signal of $V_0$ [V] or 0 [V] is input to terminals A, B and S. $V_0$ [V] is determined so that the resistance of each switching element can be varied by applying ½ of $V_0$ [V] to the control gate of each switching element with the polarity of the voltage selected. Since a fixed voltage of 0.5 $V_0$ [V] is applied to the nonlinear resistance elements 87 and 88, a complementary signal (signal of the opposite polarity) with respect to the input signal S is input to the control gates of the switching elements 85 and 86. Accordingly, if one of the complementary signals is used to make the phase change film have a crystal phase, and the other signal is used to make it have an amorphous phase, the structure of FIG. 12B operates in completely the same manner as the structure of FIG. 12A.

Thus, the seventh embodiment needs no MOS transistors, and only uses two diodes smaller than MOS transistors, with the result that the required circuit area can be significantly reduced. Further, since no MOS transistors are necessary, static current consumption is significantly reduced, resulting in a reduction in power consumption. Namely, the seventh embodiment is advantageous in downsizing and power consumption.

Eighth Embodiment

Figure 13A:
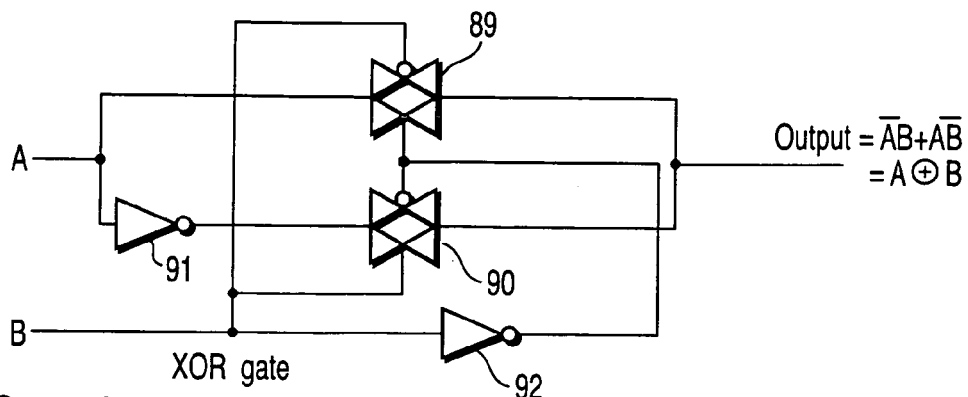
FIG. 13A is a circuit diagram illustrating an example of a logic circuit using a switching element, more specifically, an exclusive logic circuit (XOR) formed of six transistors.
Figure 13B:
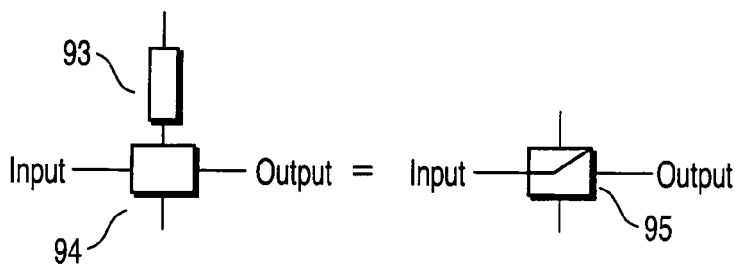
FIGS. 13B and 13C are circuit diagrams illustrating examples of logic circuits (XOR) using a switching element according to an eighth embodiment.
Figure 13C:
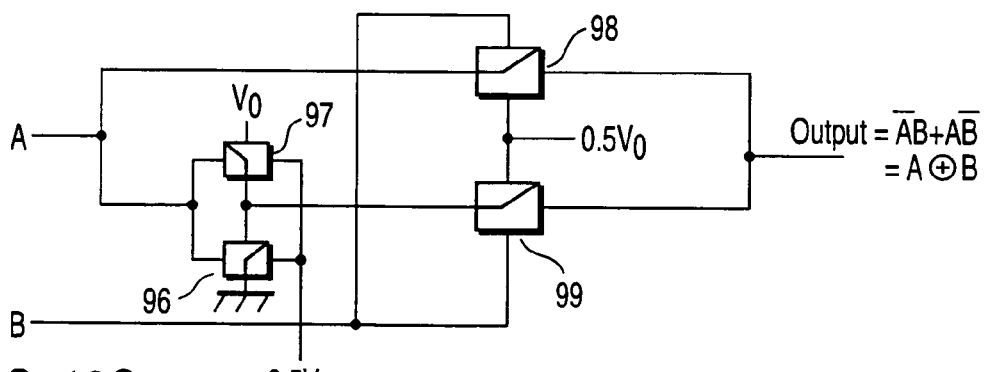

FIGS. 13A to 13C are views useful in explaining an eighth embodiment of the invention. FIG. 13A is a circuit diagram illustrating a conventional exclusive logic circuit (XOR) formed of six transistors. FIGS. 13B and 13C are circuit diagrams illustrating XOR circuits according to an eighth embodiment of the invention.

As shown in FIG. 13A, the conventional XOR circuit comprises two transfer gates 89 and 90 and two inverters 91 and 92. Since the transfer gates 89 and 90 and inverters 91 and 92 each comprise two MOS transistors, eight MOS transistors are used in total.

In contrast, the XOR circuit of FIG. 13B, according to the eighth embodiment, comprises a switching block 95 that includes a switching element 93 and a nonlinear resistance element 94 connected thereto in series.

The operation of the switching block shown in FIG. 13B is similar to that described in the seventh embodiment. In this case, four switching blocks are used to form an XOR circuit, therefore it is sufficient if four diodes smaller than MOS transistors are used, which significantly reduces the required circuit area. Further, since no MOS transistors are necessary, static current consumption is significantly reduced, resulting in a reduction in power consumption. Namely, the eighth embodiment is also advantageous in downsizing and power consumption.

The XOR circuit of FIG. 13C, according to the eighth embodiment, comprises inverters 96 and 97 (NOT circuits) and AND circuits 98 and 99.

If NOT and AND circuits are appropriately combined, all types of logic circuits, such as AND, OR and NOR circuits, can be constructed using switching blocks according to the eighth embodiment.

Ninth Embodiment

Figure 14:
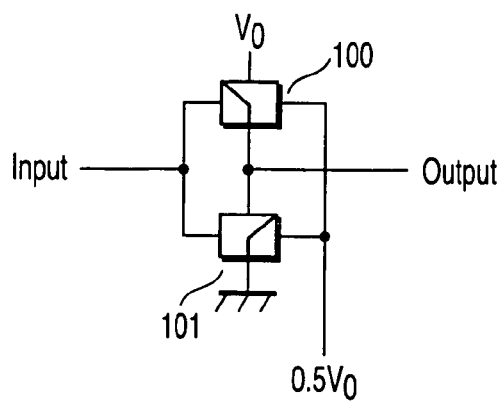
FIG. 14 is a circuit diagram illustrating an example of a logic circuit using a switching element according to an eighth embodiment.

FIG. 14 shows a nonvolatile memory according to a ninth embodiment of the invention. The nonvolatile memory comprises such two switching blocks as described in the eighth embodiment.

Two switching blocks 100 and 101 are arranged to complementarily turn on and off a digital input signal ($V_0$ [V] or 0 [V]), thereby generating an output signal that is an inverse signal with respect to the input signal. Therefore, the switching blocks can serve as both an inverter circuit and memory, since the output ($V_0$ [V] or 0 [V]) is nonvolatile. In other words, the ninth embodiment can be regarded as a memory acquired by making an SRAM nonvolatile, and can be used instead of an SRAM.

Tenth Embodiment

Figure 15A:
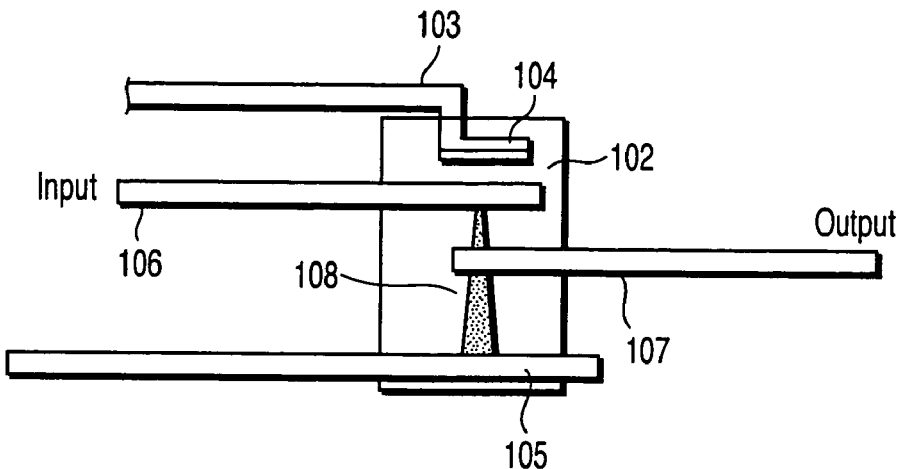
FIG. 15A is a plan view illustrating an example of a logic circuit using a switching element according to a tenth embodiment.
Figure 15B:
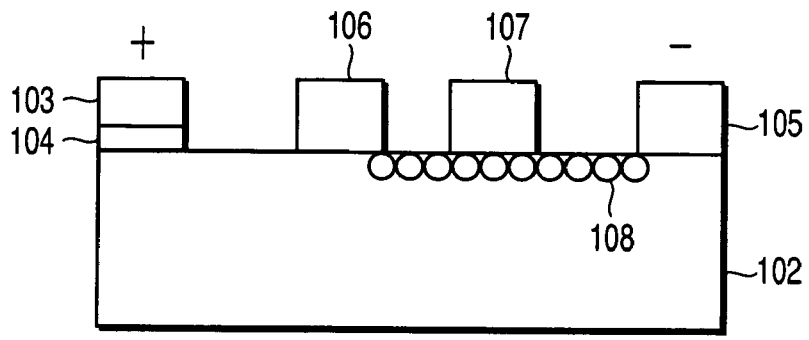
FIG. 15B is a sectional view illustrating the logic circuit shown in FIG. 15A.

FIGS. 15A and 15B show a switching element utilizing an ionic conduction phenomenon, according to a tenth embodiment of the invention. FIG. 15A is a plan view of the switching element. FIG. 15B is a sectional view of the switching element. This switching element is produced in the following manner.

A film of silver, germanium and selenium is formed on an $SiO_2$ film by sputtering, and then subjected to etching and lithography to form a compound 102 of silver, germanium and selenium. An aluminum wire 103 serving as a control gate is provided on part of the compound 102. A tip 104 of silver is provided on the aluminum wire 103 by lithography and etching.

Another aluminum wire 105 serving as another control gate is provided on the compound 102, separate from the aluminum wire 103. An input electrode 106 and output electrode 107 are formed between the control gate wires 103 and 105 by lithography and etching.

In the above structure, when a voltage is applied between the control gate wires 103 and 105 so that the wire 103 will serve as the plus terminal, plus ions of silver are conducted from the tip 104 of the control gate wire 103 through the compound 102, and electrons are supplied from the surface of the control gate wire 105. As a result, silver ions are neutralized and deposited on the surface of the wire 105, thereby forming a metal filament 108. The metal filament 108 continuously grows toward the electrode tip 104 and causes the input and output electrodes 106 and 107 to be short-circuited. After that, when a voltage is applied between the control gate wires 103 and 105 so that the wire 103 will serve as the minus terminal, the metal filament 108 is again ionized and shrinks, whereby the input and output electrodes 106 and 107 are again isolated from each other.

Utilizing this phenomenon, the above structure can be used as a switching element having input and output electrodes connected and disconnected in accordance with the polarity of the voltage applied between the control gate wires 103 and 105. This element has the same function as the switching elements of the second and seventh to ninth embodiments, therefore can provide the same advantages as these embodiments.

In the tenth embodiment, CuS acquired by sulfurizing Cu may be used instead of the compound 102 of silver, germanium and selenium.

Eleventh Embodiment

Figures 16A, 16B:
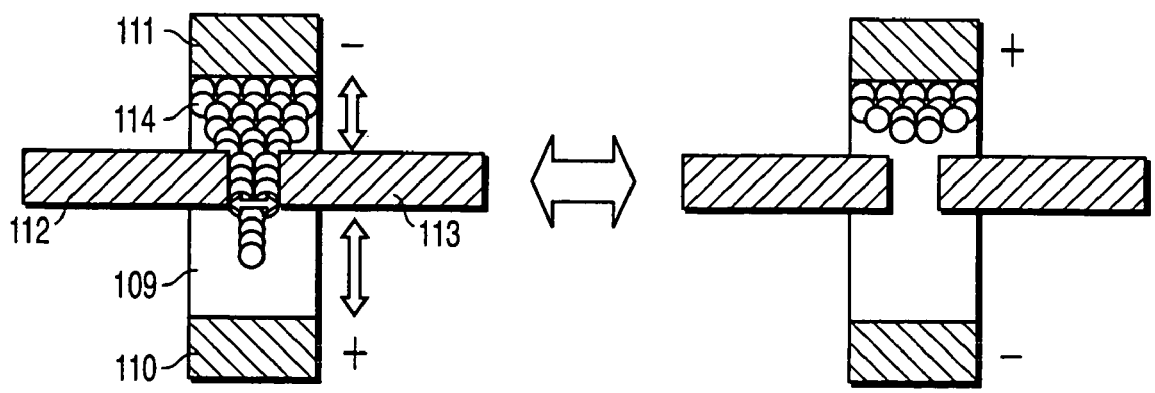
FIG. 16A is a sectional view illustrating the ON state of an example of a logic circuit using a switching element according to an eleventh embodiment.
FIG. 16B is a sectional view illustrating the OFF state of the logic circuit of FIG. 16A.

FIGS. 16A and 16B are views illustrating a switching element utilizing an ionic conduction phenomenon, according to an eleventh embodiment of the invention. This switching element is produced in the following manner.

A CuS layer 109 acquired by sulfurizing Cu is provided on a copper wire (first metal layer) 110 serving as a control gate. Input electrodes 112 and output electrodes 113 are provided on the CuS layer 109 with a pitch of several ten nanometers by lithography and etching. Cu is further deposited and sulfurized on the resultant structure to bury the electrodes 112 and 113 in the CuS layer 109. A control gate (second metal layer) 111 of titanium is formed on the CuS layer 109 in the same manner as the above.

In the above description, the wire 110, electrodes 112 and 113 and wire 111 are stacked sequentially. However, these elements may be provided horizontally. Namely, the copper wires 110 and 11 may be provided separate from each other on the CuS layer 109, and the input electrode 112 and output electrode 113 be provided between the wires 110 and 111.

In this structure, when a voltage is applied between the control gates 110 and 111 so that the gate 110 will serve as the plus terminal, plus ions of copper are conducted from the gate 110 through the CuS layer 109, and electrons are supplied from the surface of the control gate 111. Neutralized copper ions are deposited on the surface of the gate 111, thereby forming a copper filament 114. The copper filament continuously grows toward the control gate 110 and causes the input and output electrodes 112 and 113 to be short-circuited, as can be understood from FIG. 16A.

After that, when a voltage is applied between the control gates 110 and 111 so that the control gate 110 will serve as the minus terminal, the copper filament 114 is again ionized and shrinks, whereby the input and output electrodes 106 and 107 are again isolated from each other as shown in FIG. 16B.

Utilizing this phenomenon, the above structure can be used as a switching element having input and output electrodes connected and disconnected in accordance with the polarity of the voltage applied between the control gates. This element has the same function as the switching elements of the second and seventh to ninth embodiments, therefore can provide the same advantages as these embodiments.

Figure 17A:
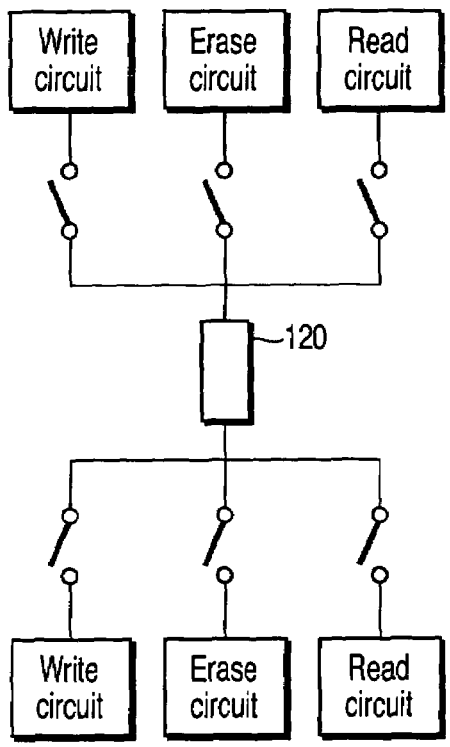
FIG. 17A is a circuit diagram useful in explaining the advantages of the eleventh embodiment, and illustrating a case where a two-terminal solid electrolyte switch is used as a memory element.
Figure 17B:
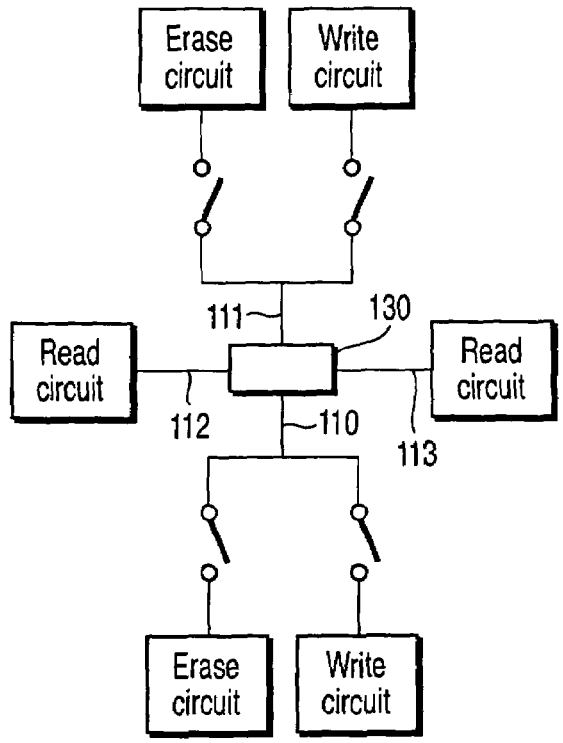
FIG. 17B is a circuit diagram useful in explaining the advantages of the eleventh embodiment, and illustrating a case where a four-terminal solid electrolyte switch is used as a memory element.

FIGS. 17A and 17B are views useful in explaining the advantages of the eleventh embodiment. FIG. 17A illustrates a case where a two-terminal solid electrolyte switch is used as a memory element. FIG. 17B illustrates a case where a four-terminal solid electrolyte switch is used as a memory element.

Where a two-terminal solid electrolyte switch 120 is used as a memory element, it is necessary to impart switches for a write circuit, erase circuit and read circuit to each of the two electrodes 110 and 111 of the switching element 120, as is shown in FIG. 17A. Namely, six switches are necessary for one switching element, i.e., a large number of switching transistors are required.

In contrast, where a four-terminal solid electrolyte switch 130 is used as a memory element as in the eleventh embodiment, read circuits can be always connected to the input and output electrodes 112 and 113 as shown in FIG. 17B. Accordingly, it is necessary to impart switches for a write circuit and erase circuit to each of the electrodes 110 and 111. This means that four switches are necessary for one switching element, i.e., a smaller number of switching transistors than the above are needed. In other words, the required chip area can be reduced.

Furthermore, writing/erasure can be also performed by inputting an output signal of another digital circuit to the four-terminal solid electrolyte switch and controlling the ON and OFF states of the switch. In this case, no particular write circuit or erasure circuit are necessary, thereby further advancing the downsizing and simplification of the circuit.

Twelfth Embodiment

Figure 18A:
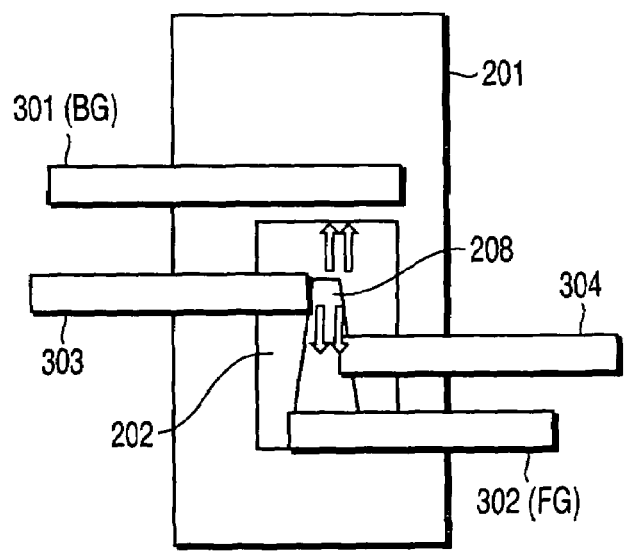
FIG. 18A is a plan view illustrating an example of a logic circuit using a switching element according to a twelfth embodiment.
Figure 18B:
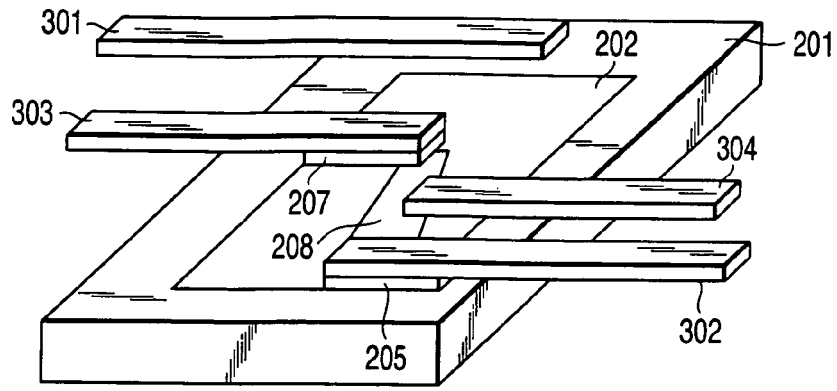
FIG. 18B is a sectional view illustrating the logic circuit shown in FIG. 18A.

FIGS. 18A and 18B are views illustrating a switching element utilizing an ionic conduction phenomenon, according to a twelfth embodiment of the invention. FIG. 18A is a plan view of the switching element. FIG. 18B is a sectional view of the switching element. This switching element is produced in the following manner.

A film of silver, germanium and selenium is formed on an $SiO_2$ film 201 by sputtering, and then subjected to etching and lithography to form a compound 202 of silver, germanium and selenium. Subsequently, another $SiO_2$ film 201 is formed by sputtering, lithography and etching to surround the compound 202 of silver, germanium and selenium.

After that, a first electrode 301 of an aluminum wire serving as a control gate (BG) is provided on an end of the compound 202. Similarly, a second electrode 302 of an aluminum wire serving as a control gate (FG) is provided on another end of the compound 202, opposing the first electrode 301. Further, an input electrode 303 (third electrode) with a tip 207 of silver formed by lithography and etching, and an output electrode 304 (fourth electrode) are provided between the first and second electrodes 301 and 302 by lithography and etching. The fourth electrode 304 is provided closer to the second electrode 302 than the third electrode 303.

The $SiO_2$ film existing between the control gate FG (second electrode 302) and the compound 202 of silver, germanium and selenium serves as a tunnel barrier. The $SiO_2$ film existing between the control gate BG (first electrode 301) and the compound 202 is made not to permit electrons to move therein. More specifically, the control gate BG is provided not just above the compound 202, but on the $SiO_2$ film 201 along the upper edge of the compound 202, while the control gate FG is provided on the compound 202 with a tunnel insulation film 205 with a thickness of about 3 nm interposed therebetween.

Although in the above example, the electrodes 301 to 304 are formed of a single layer and provided on the compound 202 of silver, germanium and selenium, they may be stacked on each other as in the eleventh embodiment.

In the above structure, when voltages of $-V_0$ [V] and 0 [V] are applied to the control gates BG and FG, respectively, plus ions of silver are conducted from the tip of the input electrode 303 through the compound 202. Since the thick $SiO_2$ film 201 exists between the control gate BG and the compound 202 of silver, germanium and selenium, no electrons are supplied from the control gate BG into the compound 202, with the result that silver ions are saturated in the portion of the compound 202 close to the control gate BG. In contrast, electrons are supplied by tunnel conduction from the control gate FG into the portion of the compound 202 close to the gate FG, with the result that silver ions in this portion are neutralized by the electrons and deposited at the boundary between the compound 202 and the tunnel insulation film 205. The deposited silver forms a silver filament 208, which continuously grows below the output electrode 304 toward the tip of the input electrode 303. As a result, the input and output electrodes 303 and 304 are short-circuited via the silver filament 208.

After that, when $V_0$ [V] is applied to the control gate FG, the silver filament 208 is again ionized and shrinks, whereby the input and output electrodes 303 and 304 are again separated.

Figure 19:
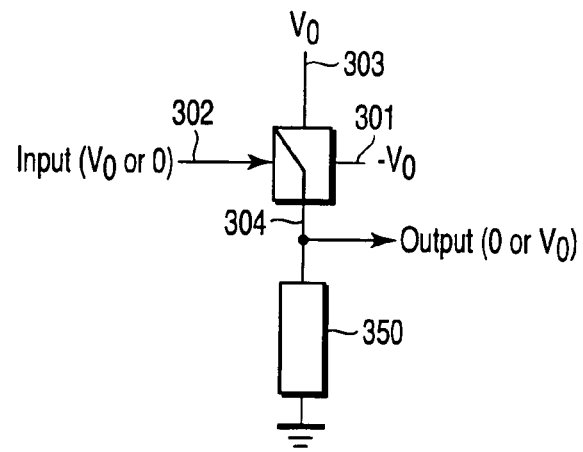
FIG. 19 is a circuit diagram illustrating an example of an inverter using the switching element shown in FIGS. 18A and 18B.

FIG. 19 shows an example of an inverter circuit using the switching element of the twelfth embodiment. In this structure, a fixed voltage of $-V_0$ [V] is applied to the first electrode 301 as a back gate BG input, while $V_0$ [V] or 0 [V] is applied to the second electrode 302 as a gate input. Further, a fixed voltage of $V_0$ [V] is applied to the third electrode 303. A load 350 is connected between the fourth electrode 304 and the ground terminal.

Figure 20A:
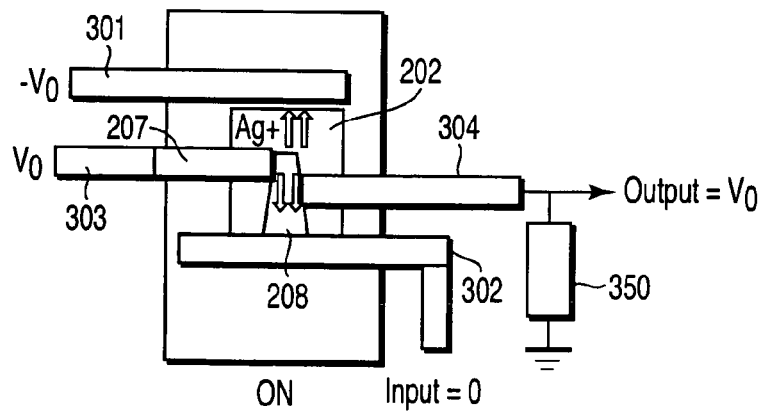
FIG. 20A is a view illustrating the inverter of FIG. 19, which is in the ON state.

As shown in FIG. 20A, when 0 [V] is input as an input voltage to the second electrode 302, Ag ions are conducted from an Ag electrode 207 provided at the tip of the third electrode 303, to the electrode 302. At the electrode 302, electrons are supplied to the Ag ions through the tunnel insulation film 205, thereby neutralizing them into a metal whisker. This whisker grows from the electrode 302 to the Ag electrode 207. As a result, the third electrode 303 as a fixed-voltage input electrode and the fourth electrode 304 as an output electrode are short-circuited.

Figure 20B:
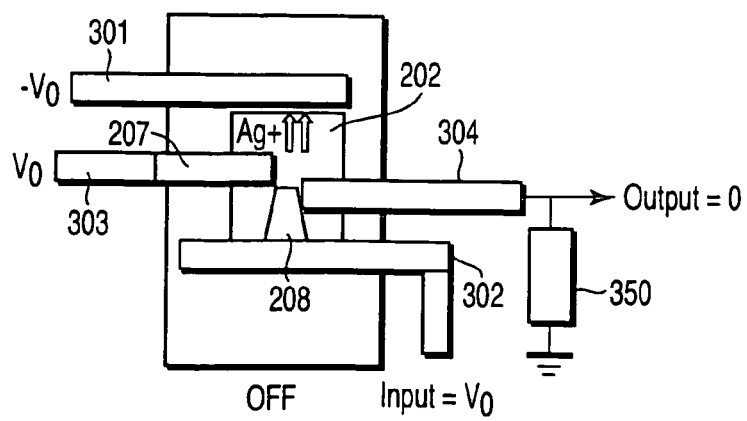
FIG. 20B is a view illustrating the inverter of FIG. 19, which is in the OFF state.

On the other hand, as shown in FIG. 20B, when $V_0$ [V] is input as an input voltage to the second electrode 302, the Ag whisker is melted toward the back gate side and shortened. As a result, the third electrode 303 as the fixed-voltage input electrode and the fourth electrode 304 as the output electrode are isolated, whereby the inverter is turned off.

Utilizing this phenomenon, the above structure can be used as a switching element having input and output electrodes connected and disconnected in accordance with the voltage applied to the control gate FG. This element has the same function as the switching elements of the second and seventh to ninth embodiments, therefore can provide the same advantages as these embodiments.

Modification

The invention is not limited to the above-described embodiments. Although in the embodiments, the phase change film is formed of GeSeTe, it may be formed of any other chalcogenide-based material. Further, the material is not limited to chalcogenide materials. It is sufficient if the material has its crystal condition varied depending upon temperature, and has its resistance greatly varied depending upon the crystal condition.

Furthermore, the materials of, for example, the insulation film and resistance heating member, which are provided on the phase change film, may be changed in accordance with the specifications of the device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A switching element comprising:
   a pair of input/output electrodes provided on a substrate separately from each other;
   a phase change film provided in contact with the electrodes, a resistance of the phase change film being varied in accordance with a history of heating, the phase change film being crystallized and provided with a low resistance when the phase change film is heated to a first temperature suitable for crystallization, and being made amorphous and provided with a high resistance when the phase change film is heated to a second temperature higher than the first temperature;
   an interlayer insulation film formed on the phase change film; and
   a heating mechanism which is formed on the interlayer insulation film and heats the phase change film, the heating mechanism including: (i) a pair of current supply electrodes arranged on the interlayer insulation film and being apart from each other; (ii) a resistance heating film formed on the interlayer insulation film, having one end connected to one of the current supply electrodes, and configured to heat the phase change film; and (iii) a nonlinear resistor element formed on the interlayer insulation film, connected between the other end of the resistance heating film and the other one of the current supply electrodes, and showing different resistance values depending upon directions in which a current is supplied,
   wherein the phase change film is heated to the first temperature by the resistance heating film when a predetermined voltage is applied between the current supply electrodes in one direction, and the phase change film is heated to the second temperature by the resistance heating film when the predetermined voltage is applied between the current supply electrodes in a direction opposite to said one direction.

2. The switching element according to claim 1, wherein the nonlinear resistance element is a pn-junction diode.

3. The switching element according to claim 2, further comprising an insulation film interposed between the input/output electrodes, upper surfaces of the input/output electrodes being level with an upper surface of the insulation film, the phase change film being continuously formed on the electrodes and the input/output insulation film.

4. The switching element according to claim 2, wherein the phase change film is formed of a phase change material including a chalcogenide-based material.

5. The switching element according to claim 1, further comprising an insulation film interposed between the input/output electrodes, upper surfaces of the input/output electrodes being level with an upper surface of the insulation film, the phase change film being continuously formed on the input/output electrodes and the insulation film.

6. The switching element according to claim 1, wherein the phase change film is formed of a phase change material including a chalcogenide-based material.

* * * * *